(12) United States Patent
Naito et al.

(10) Patent No.: US 7,323,093 B2
(45) Date of Patent: *Jan. 29, 2008

(54) PRODUCING METHOD OF FLEXIBLE WIRED CIRCUIT BOARD

(75) Inventors: Toshiki Naito, Osaka (JP); Yoshifumi Shinogi, Osaka (JP); Takeshi Yamato, Osaka (JP)

(73) Assignee: Nitto Denko Corporation, Osaka (JP)

( * ) Notice: Subject to any disclaimer, the term of this patent is extended or adjusted under 35 U.S.C. 154(b) by 505 days.

This patent is subject to a terminal disclaimer.

(21) Appl. No.: 10/950,428

(22) Filed: Sep. 28, 2004

(65) Prior Publication Data

US 2005/0067293 A1    Mar. 31, 2005

(30) Foreign Application Priority Data

Sep. 29, 2003  (JP) .............................. 2003-337049

(51) Int. Cl.
*C25D 1/00*  (2006.01)
*C25D 5/02*  (2006.01)

(52) U.S. Cl. ..................... 205/67; 205/125; 205/130; 205/138; 156/230; 174/254

(58) Field of Classification Search .................. 205/67, 205/76, 77, 129, 130, 137, 138, 152; 156/230; 428/98; 174/254, 255
See application file for complete search history.

(56) References Cited

U.S. PATENT DOCUMENTS 4,806,409 A * 2/1989 Walter et al. ................ 428/138
4,980,034 A * 12/1990 Volfson et al. ............. 205/122
5,567,328 A    10/1996 Engle et al.
5,972,152 A    10/1999 Lake et al.
6,210,518 B1    4/2001 Lee et al.
6,702,916 B2 *  3/2004 Smith ......................... 156/230
2006/0076242 A1*  4/2006 Naito .......................... 205/125

FOREIGN PATENT DOCUMENTS

JP        06132628       5/1994
JP        9-136378       5/1997
JP       2002-299385    10/2002

* cited by examiner

*Primary Examiner*—Nam Nguyen
*Assistant Examiner*—Luan V. Van
(74) *Attorney, Agent, or Firm*—Jean C. Edwards, Esq.; Akerman Senterfitt

(57) ABSTRACT

A producing method of a flexible wired circuit board that can prevent the formation of a gap between an elongate substrate and a stiffener sheet bonded thereto to prevent contamination of the flexible wired circuit board obtained. In the process subsequent to the process of forming a conductive pattern 3 on a surface of the elongate substrate 1 by the semi-additive process using electrolysis plating and then annealing the elongate substrate 1 with the conductive pattern 3 in its wound up state, a stiffener sheet 9 having a width narrower than the elongate substrate 1 is bonded to the back side of the elongate substrate 1. Thereafter, an oxidized film formed on a surface of the conductive pattern 3 is removed and then a solder resist 11 is formed thereon. This prevents the strip of the stiffener sheet 9 from the elongate substrate 1 and in turn prevents etching solution or developing solution from entraining in a gap therebetween.

3 Claims, 3 Drawing Sheets

(a)

(b)

(c)

(d)

(e)

(f)

(g)

(h)

(i)

(j)

(k)

PRODUCING METHOD OF FLEXIBLE WIRED CIRCUIT BOARD

This application claims priority from Japanese Patent Application No. 2003-337049. filed Sep. 29, 2003, the entire contents of which are herein incorporated by reference to the extent allowed by law.

BACKGROUND OF THE INVENTION

1. Field of the Invention

The present invention relates to a producing method of a flexible wired circuit board and, more particularly, to a method of producing a flexible wired circuit board, while an elongate substrate is conveyed using rolls.

2. Description of the Prior Art

The method of forming a conductive pattern on a surface of an elongate substrate of a polyimide sheet or the like, while the elongate substrate is conveyed using rolls, for improvement in production efficiency of the flexible wired circuit board, is known.

Along with the trend toward lighter, thinner, and more compact electronic components, the trend in flexible wired circuit boards is also toward thinner profile. A thin, elongate, substrate is however apt to be creased or get wrinkled when conveyed using rolls. To prevent this, for example JP Laid-open (Unexamined) Patent Publication No. Hei 6-132628 proposes that a carrier film, such as a polyethylene terephthalate film, is bonded to a surface of a thin, copper clad laminate.

Meanwhile, along with improvements in a fine conductive pattern in recent years, attention has been attracted of a semi-additive process to form the conductive pattern by electrolysis plating. When the conductive pattern is formed by the electrolysis plating, the following problems occur with the above-said flexible wired circuit board with the carrier sheet bonded to the elongate substrate, however.

In general, in the electrolysis plating, a current density becomes higher at both widthwise end portions of the elongate substrate than at a central portion of the same. As a result, thickness of the conductive pattern plated becomes larger at the both widthwise ends of the elongate substrate than at the central portion of the same. When the elongate substrate is rolled up after the electrolysis plating, differences in thickness between the both end portions of the elongate substrate and the central portion of the same are accumulated. As a result of this, the elongate substrate is undulated and deformed plastically at the both widthwise end portions by the wind-up pressure, causing the bonded carrier sheet to be stripped off from the elongate substrate at the both end portions thereof.

This may in turn cause the problem that in the process subsequent to the conductive pattern forming process, etching solution or developing solution is entrained into a gap between the carrier sheet and the elongate substrate at both end portions thereof formed by the strip of the carrier sheet from the elongate substrate via the capillary phenomenon. Then, the entrained solution remains through the subsequent processes, causing contamination of the flexible wired circuit board obtained.

SUMMARY OF THE INVENTION

It is an object of the present invention to provide a producing method of a flexible wired circuit board that can prevent the formation of a gap between an elongate substrate and a stiffener sheet bonded thereto to prevent contamination of the flexible wired circuit board obtained.

The present invention provides a producing method of a flexible wired circuit board comprising the process of forming a conductive pattern on a surface of an elongate substrate by electrolysis plating, and the process of providing a stiffener sheet having a width narrower than the elongate substrate on a back side of the elongate substrate on its side opposite to the front side where the conductive pattern is formed.

In the producing method of the flexible wired circuit board of the present invention, it is preferable that the stiffener sheet is provided on the elongate substrate, with its widthwise edge placed 1-10 mm inwardly from widthwise edge of the elongate substrate.

In the producing method of the flexible wired circuit board of the present invention, it is preferable that the elongate substrate has a thickness of 5-50 μm.

According to the producing method of the flexible wired circuit board of the present invention, even when the electrolysis plating for forming the conductive pattern causes the plated conductive pattern to be larger in thickness at the both end portions thereof than at the widthwise central portion thereof with respect to the widthwise direction of the elongate substrate and in turn causes the elongate substrate to be undulated and deformed plastically at the both widthwise end portions thereof by the wind-up pressure, since the stiffener sheet having a width narrower than the elongate substrate is provided on the elongate substrate, the stiffener sheet can be prevented from being stripped off from the both end portions of the elongate substrate.

As a result of this, the stiffener sheet is prevented from being stripped off from the elongate substrate in the producing processes, while the fine conductive pattern can be formed on the thin, elongate, substrate efficiently by the electrolysis plating. This can prevent the occurrence that the etching solution or developing solution entrains into the gap between the stiffener sheet and the elongate substrate via the capillary phenomenon, and as such can prevent the occurrence of contamination of the flexible wired circuit board obtained.

Figure 1:
FIG. 1 is a production process drawing showing an embodiment of a producing method of a flexible wired circuit board of the present invention.
Figure 1:
Figure 1:
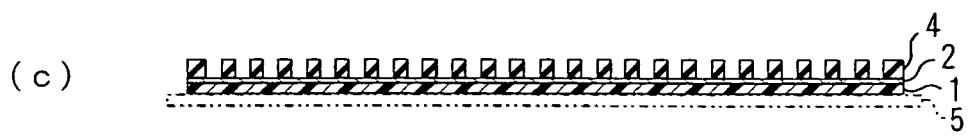
Figure 1:
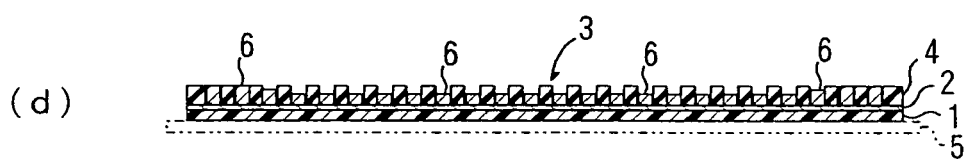
Figure 1:
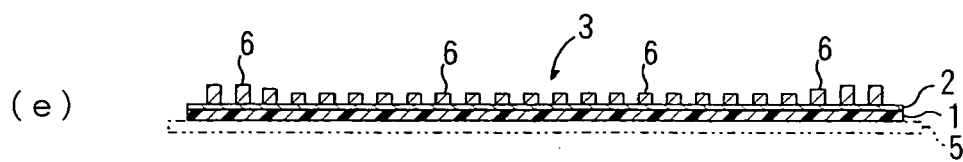
Figure 1:
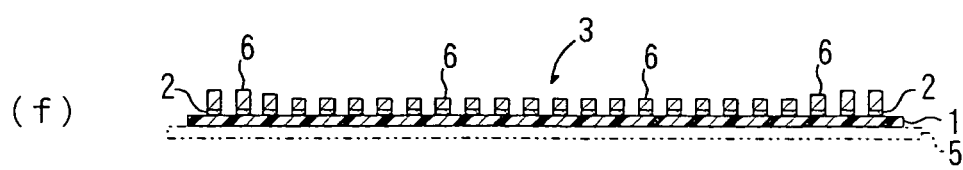
Figure 2:
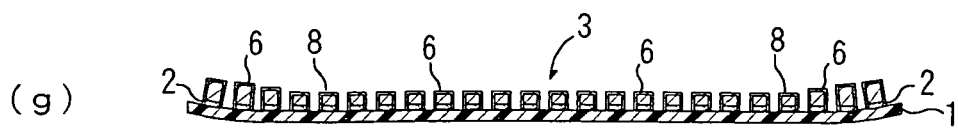
Figure 2:
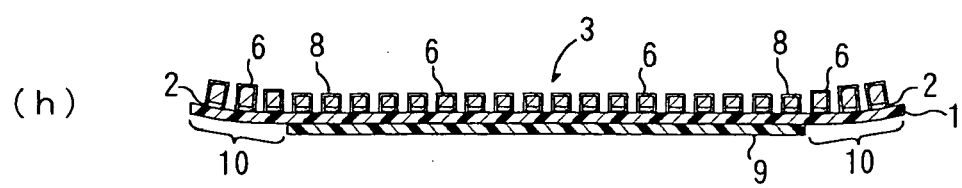
Figure 2:
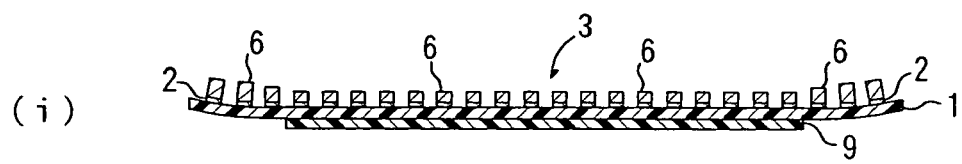
Figure 2:
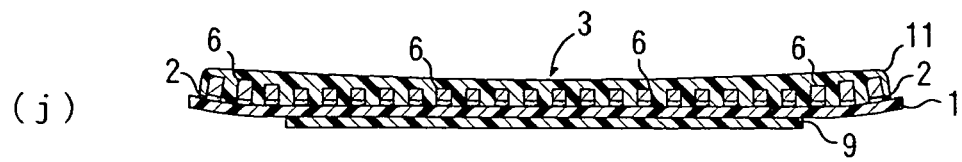
Figure 2:
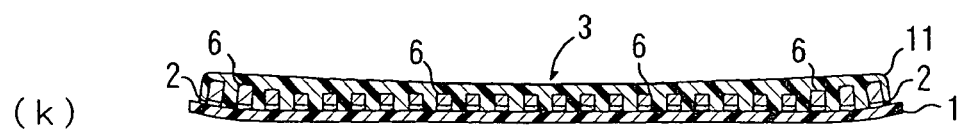
Figure 3:
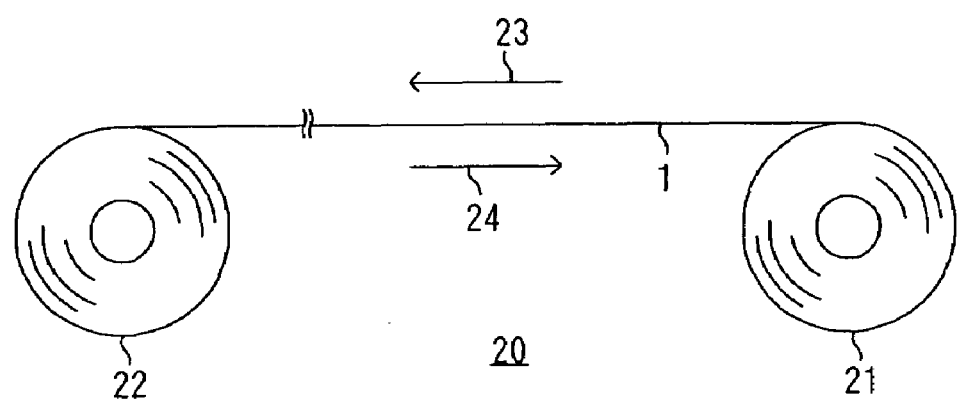

(a) shows the process of preparing an elongate substrate;

(b) shows the process of forming a thin metal film on the entire surface of the elongate substrate;

(c) shows the process of forming on the thin metal film a plating resist of a reversed pattern of a conductive pattern;

(d) shows the process of forming a conductive pattern by electrolysis plating on the thin metal film in an area thereof where the plating resist is not formed;

(e) shows the process of removing the plating resist; and (f) shows the process of removing the thin metal film exposed from the conductive pattern, FIG. 2 is a production process drawing subsequent to the production process of FIG. 1, showing the embodiment of the producing method of the flexible wired circuit board of the present invention:

(g) shows the process of annealing;

(h) shows the process of providing a stiffener sheet having a width narrower than a width of the elongate substrate on a back side of the elongate substrate;

(i) shows the process of removing an oxidized film on a surface of the conductive pattern;

(j) shows the process of forming a solder resist to cover the conductive pattern; and (k) shows the process of stripping the stiffener sheet from the elongate substrate, and FIG. 3 is a schematic block diagram of manufacturing equipment used for carrying out the producing method of the flexible wired circuit board shown in FIGS. 1 and 2.

DETAILED DESCRIPTION OF THE PREFERRED EMBODIMENT

FIGS. 1 and 2 are the production process drawings showing an embodiment of a producing method of a flexible wired circuit board of the present invention. FIG. 3 is a schematic block diagram of the manufacturing equipment used for carrying out the embodiment of the producing method.

In FIG. 3, the manufacturing equipment 20 is equipped with a delivery roll 21 and a wind-up roll 22 which are spaced apart at a predetermined distance from each other. In the illustrated method, an elongate substrate 1 rolled on the delivery roll 21 is delivered toward the wind-up roll 22 (in the direction indicated by an arrow 23) and is wound up by the wind-up roll 22, first, and, then, the elongate substrate 1 is rewound from the wind-up roll 22 to the delivery roll 21 (in the direction indicated by an arrow 24). These processes are alternately repeated in succession. In the course of the delivery or the rewinding, the respective processes shown in FIG. 1(b) through FIG. 2(k) are carried out in sequence.

In this method, the elongate substrate 1 is prepared, first, as shown in FIG. 1(a). The elongate substrate 1 is the one used for forming an insulating base layer of a flexible wired circuit board. Any particular limitation is imposed on the material for the elongate substrate 1, as long as it may be used for the insulating base layer. For example, resin sheets (resin films), such as polyimide resin sheet, acrylic resin sheet, polyether nitrile resin sheet, polyether sulfonic resin sheet, polyethylene terephthalate resin sheet, polyethylene naphthalate resin sheet and polyvinyl chloride resin sheet, may be used. Preferably, polyimide resin sheet is used.

The elongate substrate 1 has a thickness of e.g. 5-50 μm, or preferably 10-30 μm. The use of the elongate substrate 1 having a thickness in this order can produce a low-profile flexible wired circuit board. It usually has a width of 100-500 mm, or preferably 150-350 mm, and a length of 10-1,500 m, or preferably 100-300 m. This elongate substrate 1 is prepared in the form of an elongate sheet in a tape-like form wound up on the delivery roll 21.

Then, in order to form a conductive pattern 3 by the semi-additive process in this method, a thin metal film 2 is formed on the entire surface of the elongate substrate 1, as shown in FIG. 1(b). No particular limitation is imposed on the process of forming the thin metal film 2. For example, a vacuum deposition process or a sputtering process can be used to form the thin metal film 2. Preferably, the sputtering is used. Also, chromium and copper are preferably used as the metal for forming the thin metal film 2.

To be more specific, a thin chrome film and a thin copper film are formed in sequence on the entire surface of the elongate substrate 1 by the sputtering process. The metal film 2 is formed so that the thin chrome film can have thickness of e.g. 5-50 nm and the thin copper film can have thickness of e.g. 50-500 nm.

In the process of forming the thin metal film 2 on the elongate substrate 1, no large stress is exerted on the elongate substrate 1, so that a stiffener sheet 5 need not yet be bonded to the elongate substrate 1 in this stage.

Then, a plating resist 4 of a reversed pattern of the conductive pattern 3 is formed on the thin metal film 2, as shown in FIG. 1(c). The plating resist 4 of the reversed pattern of the conductive pattern 3 is formed on the thin metal film 2 by a known method that a photosensitive dry film resist is bonded to a surface of the thin metal film 2, or liquid photoresist is applied thereto and dried, and then the resultant film is exposed to light and developed.

It should be noted that in the process of forming the plating resist 4 and the subsequent process of forming the conductive pattern 3 as mentioned next, the stiffener sheet 5 should preferably be provided on the elongate substrate 1.

The stiffener sheet 5 is bonded to the back side of the elongate substrate 1 or on the back side thereof opposite to the front side where the plating resist 4 is formed. The stiffener sheet 5 can be provided on the elongate substrate 1 in the following manner. For example, the same resin sheet (resin film) as the one mentioned above is bonded to the elongate substrate 1 via adhesive. Alternatively, the same photosensitive dry film resist as the one mentioned above may be bonded to or the liquid resist mentioned above may applied to the elongate substrate 1 and dried in the same manner as above (except that the resultant film is exposed to light and developed).

Preferably, the stiffener sheet 5 has a thickness of e.g. 20-200 μm or preferably 50-150 μm, and a width equal to or larger than the elongate substrate 1.

Thereafter, the conductor layer 3 is formed by electrolysis plating on an area of the thin metal film 2 where the plating resist 4 is not formed, as shown in FIG. 1(d). Any conductive material may be used for forming the conductive pattern 3 without any particular limitation, as long as it can be plated by electrolysis plating. For example, copper, nickel, gold, solder, or alloys thereof may be used. Preferably, copper is used. The conductive pattern 3 has a thickness of e.g. 5-20 μm, or preferably 8-12 μm, at a widthwise center portion thereof as mentioned later. Also, the conductive pattern 3 is formed in a fine wired circuit pattern formed by a plurality of lines of wire 6 extending along a longitudinal direction of the elongate substrate 1 and arranged in parallel with each other with a given space. Each line of wire 6 usually has a width of 5-50 μm and an interval between adjacent lines of wire 6 is usually set to be 5-50 μm.

To be more specific, after the formation of the plating resist 4, this conductive pattern 3 is formed by electrolysis plating, or preferably by electrolysis copper plating, while the elongate substrate 1 passes through a plating bath continuously between the delivery roll 21 and the wind-up roll 22.

In this electrolysis plating, a current density becomes higher at both widthwise (in a direction perpendicular to the longitudinal direction of the elongate substrate 1) end portions of the elongate substrate 1 than at a widthwise central portion of the same. As a result, the lines of wire 6 of the conductive pattern 3 plated becomes larger in thickness at the both widthwise ends of the elongate substrate 1 than at the widthwise central portion of the same. To be more specific, letting the thickness of the lines of wire 6 at the widthwise central portion of the conductive pattern 3 be 100%, the thickness of the lines of wire 6 at the both widthwise ends of the same becomes 105-150%.

Then, the plating resist 4 is removed by a known etching process, such as a chemical etching (wet etching), or by stripping, as shown in FIG. 1(e). Thereafter, the thin metal film 2 exposed from the conductive pattern 3 is also removed by the known etching process such as the chemical etching (wet etching), as shown in FIG. 1(*f*).

Then, if the stiffener sheet 5 is provided on the backside of the elongate substrate 1, then the stiffener sheet 5 is also stripped from the elongate substrate 1. Thereafter, the resultant elongate substrate 1 is wound up on the delivery roll 21 or the wind-up roll 22. Then, the elongate substrate 1 thus wound up is annealed as it is, to crystallize the conductive pattern 3. It is to be noted that as the elongate substrate 1 is wound up on the roll, differences in thickness between the both end portions of the elongate substrate 1 and the central portion of the same are accumulated, so that the elongate substrate 1 is undulated and deformed plastically at the both end portions by the wind up pressure.

The elongate substrate 1 is annealed by heating at e.g. 150-300° C., or preferably at 180-270° C., for 1-10 hours, or preferably for 2-5 hours. As the result of this annealing, an oxidized film 8 is formed on the surface of the conductive pattern 3, as shown in FIG. 2(*g*).

Thereafter, a stiffener sheet 9 having a width narrower than the elongate substrate 1 is formed on the back side of the elongate substrate 1 on the opposite side to the front side where the conductive pattern 3 is formed, as shown in FIG. 2(*h*).

The stiffener sheet 9 is formed, for example, from the same resin sheet (resin film) as above, or preferably from a polyethylene terephthalate film. The resin sheet having a width of e.g. 90-498 mm, or preferably 145-345 mm, is used as the stiffener sheet 9. Letting the width of the elongate substrate 1 be 100%, the width of the stiffener sheet 9 is preferably in the range of 90.0% to 99.6%, or preferably in the range of 96.7% to 98.6%.

The stiffener sheet 9 is bonded to the back side of the elongate substrate 1 via known adhesive, for example. To be more specific, the stiffener sheet 9 is bonded to the elongate substrate 1 in such a manner as to allow margins 10 at the both end portions of the elongate substrate 1, in order not to overlap with the both end portions of the elongate substrate 1 as were deformed plastically by annealing. Each margin 10 is preferably set to have a width of 1-10 mm, or preferably 2-5 mm. As a result of this, the stiffener sheet 9 is bonded to the elongate substrate 1, with its both widthwise edges placed 1-10 mm, or preferably 2-5 mm, inwardly from the both widthwise edges of the elongate substrate 1.

This can provide the result that even when the elongate substrate 1 to which the stiffener sheet 9 was bonded is wound up on the delivery roll 21 or the wind-up roll 22 in the subsequent processes, since the stiffener sheet 9 is not bonded to the both end portions of the elongate substrate 1 as were deformed plastically, the stiffener sheet 9 is prevented from being stripped off from the elongate substrate 1.

Then, the oxidized film 8 on the surface of the conductive pattern 3 is removed, as shown in FIG. 2(*i*). The oxidized film 8 is removed using the chemical etching (wet etching), for example. To be more specific, the oxidized film 8 is removed by soft etching using mixed solution of hydrogen peroxide and nitric acid as an etching solution.

In this etching process, since the stiffener sheet 9 is prevented from being stripped off from the elongate substrate 1, the occurrence that the etching solution entrains into the gap formed therebetween by the strip of the stiffener sheet 9 via the capillary phenomenon is prevented.

Then, a solder resist 11 is formed to cover the conductive pattern 3, as shown in FIG. 2(*j*).

The solder resist 11 is formed by a photographic method according to which for example liquid solution of photosensitive solder resist is applied to the surface of the elongate substrate 1 including the conductive pattern 3 and then dried, to form a paint film, first, and then the paint film is exposed to light and developed.

In the developing process of the photographic method as well, since the stiffener sheet 9 is prevented from being stripped off from the elongate substrate 1, the occurrence that developing solution entrains into the gap formed therebetween by the strip of the stiffener sheet 9 via the capillary phenomenon can be prevented.

In place of the formation of the solder resist 11, an insulating cover layer to cover the conductive pattern 3 may be formed from photosensitive polyimide resin, for example.

Then, the stiffener sheet 9 is stripped off from the elongate substrate 1 to obtain a flexible wired circuit board, as shown in FIG. 2(*k*).

When the flexible wired circuit board is produced by this method, the following result is obtained. Even when the electrolysis plating for forming the conductive pattern 3 causes the lines of wire 6 of the conductive pattern 3 to be larger in thickness at the both widthwise end portions of the elongate substrate 1 than at the widthwise central portion of the same and in turn causes the elongate substrate 1 to be undulated and deformed plastically at the both widthwise end portions thereof by the wind-up pressure when the elongate substrate 1 is wound up on the delivery roll 21 or the wind-up roll 22, since the stiffener sheet 9 is bonded to the elongate substrate 1 in such a manner as not to overlap with the plastically deformed end portions of the elongate substrate 1 in the subsequent process, the stiffener sheet 9 can be prevented from being stripped off from the both end portions of the elongate substrate 1 when wound up in the subsequent processes.

This can produce the result that the stiffener sheet 9 can be prevented from stripped off from the elongate substrate 1, while the fine conductive pattern 3 can be formed efficiently by the electrolysis plating. As a result of this, the occurrence that in the process subsequent to the conductive pattern 3 forming process, the etching solution or developing solution entrains into the gap between the stiffener sheet 9 and the elongate substrate 1 at both end portions thereof formed by the strip of the stiffener sheet 9 from the elongate substrate 1 via the capillary phenomenon can be prevented. This can effectively prevent the occurrence that the entrained solution remains through the subsequent processes to cause contamination of the flexible wired circuit board obtained.

EXAMPLE

While in the following, the present invention will be described in further detail with reference to Example and Comparative Example, the present invention is not limited to Example and Comparative Example.

Example 1

The delivery and the rewinding was performed between the wind-up roll and the delivery roll were alternately repeated and, in the course of the delivery or the rewinding, the following processes were carried out in sequence.

An elongate substrate of a polyimide resin sheet having a width of 250 mm and a thickness of 25 µm was prepared (Cf. FIG. 1(*a*)). Then, a thin metal film comprising a thin chromium film having a thickness of 10 nm and a thin copper film having a thickness of 200 nm was formed on the entire surface of the elongate substrate by the sputtering process (Cf. FIG. 1(*b*)).

Then, at the same time as the bonding of a photosensitive dry film resist having a width of 248 mm and a thickness of 19 μm (RY3219 (name of article) available from Hitachi Chemical Co., Ltd.) to a surface of the thin metal film, a stiffener sheet of polyethylene terephthalate resin film with adhesive having a width of 252 mm and a thickness of 50 μm was adhesively bonded to the back side of the elongate substrate. Thereafter, the photosensitive dry film resist was exposed to light and developed, to form a plating resist in the form of a reversed pattern of the conductive pattern (Cf. FIG. 1(c)).

Sequentially, a conductor pattern was formed by electrolysis copper plating on an area of the thin metal film where the plating resist was not formed (Cf. FIG. 1(d)). This conductive pattern was formed in a fine wired circuit pattern formed by a plurality of lines of wire extending along a longitudinal direction of the elongate substrate and arranged in parallel with each other with a given space. The lines of wire were set to be 25 μm in width and 25 μm in the interval between adjacent lines of wire. Also, the conductive pattern had a thickness of 12 μm at both widthwise ends thereof and a thickness of 10 μm at a widthwise central portion thereof.

Thereafter, the plating resist was stripped (Cf. FIG. 1(e)). Then, the thin metal film exposed from the conductive pattern was removed by the chemical etching (Cf. FIG. 1(f)).

Then, after the stiffener sheet was stripped off from the elongate substrate, the elongate substrate was annealed in its wound-up state (Cf. FIG. 2(g)). It was found that the elongate substrate was undulated at the both widthwise end portions when wound up on the roll in the subsequent process.

Thereafter, a polyethylene terephthalate film with adhesive having a width of 245 mm and a thickness of 50 μm, serving as a stiffener sheet, was bonded to the back side of the elongate substrate. The stiffener sheet was bonded to the elongate substrate in such a manner that its both edges are placed 2.5 mm inwardly from the both widthwise edges of the elongate substrate (Cf. FIG. 2(h)).

Then, an oxidized film produced by the annealing was removed by soft etching using mixed solution of hydrogen peroxide and nitric acid as an etching solution (Cf. FIG. 2(i)). In this soft etching process, it was found that no etching solution entrained into the gap between the stiffener sheet and the elongate substrate.

Then, liquid solution of a photosensitive solder resist was applied to the surface of the elongate substrate including the conductive pattern and then dried, to form a paint film and then the paint film was exposed to light and developed, to form a solder resist so as to cover the conductive pattern (Cf. FIG. 2(j)). In this developing process as well, it was found that no developing solution entrained into the gap between the stiffener sheet and the elongate substrate.

Then, the stiffener sheet was stripped off from the elongate substrate to obtain a flexible wired circuit board (Cf FIG. 2(k)).

The appearance of the flexible wired circuit board thus obtained was inspected, from which it was found that the flexible wired circuit board was not contaminated by the remaining components of the etching solution and the developing solution.

Comparative Example 1

Except that the stiffener sheet to be bonded to the elongate substrate after the annealing having the same width of 252 mm as the width of the elongate substrate was used and bonded to the elongate substrate in such a manner as to overlap with it completely, the same method as that of Example 1 was carried out to obtain a flexible wired circuit board.

In this method, when the elongate substrate was wound up on the roll after the stiffener sheet was bonded to the elongate substrate, the strip was found between the elongate substrate and the stiffener sheet at both ends of the elongate substrate. Due to this, in the etching of the process of removing the oxidized film, it was found that the etching solution was entrained in between the stiffener sheet and the elongate substrate via the capillary phenomenon. Also, in the development of the process of forming the solder resist, it was found that the developing solution was entrained in between the stiffner sheet and the elongate base material via the capillary phenomenon.

When an appearance of the flexible wired circuit board obtained was inspected, it was observed that the flexible wired circuit board was contaminated by the remaining components of the etching solution and the developing solution.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A producing method of a flexible wired circuit board, comprising:
   providing an elongate substrate;
   forming a conductive pattern on a surface of the elongate substrate by electrolysis plating, wherein the electrolysis plating causes the conductive pattern to be formed thicker at edge portions of the elongate substrate compared to a central portion of the elongate substrate;
   providing a stiffener sheet having a width that is narrower than a width of the elongate substrate; and
   positioning the stiffener sheet on a back side of the elongate substrate, opposite to the front side where the conductive pattern is formed, to overlap the central portion of the elongate substrate and not to overlap the edge portions of the elongate substrate.

2. The producing method of the flexible wired circuit board according to claim 1, wherein the stiffener sheet is positioned on the elongate substrate to be 1-10 mm inwardly from an edge of the elongate substrate.

3. The producing method of the flexible wired circuit board according to claim 1, wherein the elongate substrate has a thickness of 5-50 μm.

* * * * *